United States Patent [19]

Jiang et al.

[11] Patent Number: 5,072,122
[45] Date of Patent: Dec. 10, 1991

[54] CHARGE STORAGE IMAGE DEVICE USING PERSISTENT PHOTOCONDUCTIVITY CRYSTALS

[75] Inventors: Hongxing Jiang; Jingyu Lin, both of Manhattan, Kans.

[73] Assignee: Kansas State University Research Foundation, Manhattan, Kans.

[21] Appl. No.: 597,406

[22] Filed: Oct. 15, 1990

[51] Int. Cl.$^5$ .................... H01L 31/0296; G01J 5/28
[52] U.S. Cl. ........................... 250/370.08; 250/338.4; 250/370.01; 250/370.12
[58] Field of Search ............. 250/370.13, 370.12, 250/370.08, 370.01, 338.4

[56] References Cited

U.S. PATENT DOCUMENTS 3,754,965  8/1973  Mooney .......................... 430/130
4,412,235  10/1983  Bois ................................ 357/19

*Primary Examiner*—Constantine Hannaher
*Attorney, Agent, or Firm*—Hovey, Williams, Timmons & Collins

[57] ABSTRACT

Mixed II–VI crystal semiconductors (10) having the general formula $Zn_xCd_{1-x}Se$, where x is up to about 0.4, are provided which exhibit persistent photoconductivity (PPC) above 70° K. which is quenchable by infrared radiation. An electrical apparatus (12) utilizing the crystal (10) of the invention is also provided. An imaging apparatus (70) is further provided which includes a charge storage image device (72) having an array (82) of mixed II–VI semiconductor elements (84). A visible or an infrared image is stored in array (82) by first initializing array (82) and then exposing elements (84) to the image to be recorded.

21 Claims, 4 Drawing Sheets

CHARGE STORAGE IMAGE DEVICE USING PERSISTENT PHOTOCONDUCTIVITY CRYSTALS

BACKGROUND OF THE INVENTION

1. Field of the Invention

The present invention is broadly concerned with crystalline bodies having atoms of Groups II and VI therein which exhibit persistent photoconductivity (PPC), a phenomenon of photo-induced conductivity that persists for a very long period of time after the removal of an exciting light source. More particularly, it is concerned with II-VI mixed crystals having the general formula $Zn_xCd_{1-x}Se$, where x is up to about 0.4, and with complete electrical apparatus (e.g., sensors, detectors, and solid state imagers) using the PPC crystals of the invention.

2. Description of the Prior Art

One of the most interesting and important phenomena under intensive investigation in the field of semiconductor materials is the slow relaxation of photoexcited charge carriers, manifested as persistent photoconductivity (PPC). The PPC effect has been observed in a great variety of materials. Prior PPC materials demonstrate PPC relaxation times which generally decrease with increasing temperature. Several mechanisms have been proposed to explain the effect. One such mechanism is the so-called macroscopic barrier model, which predicts a PPC decay essentially logarithmic in time for artificially constructed layered materials. This prediction is consistent with experimental observations. However, PPC in bulk semiconductors is not yet well understood, and usually cannot be described by this model.

Another proposed mechanism is the DX center model, which involves photoexcitation of electrons from deep level traps which undergo a large lattice relaxation. According to this model, PPC is induced because recapture of electrons by DX centers is prevented by a thermal barrier at low temperatures. This model explains many PPC features as well as the large Stokes shift observed in $Al_xGa_{1-x}As$ materials. The nature of the DX centers is still being investigated intensively.

These two models predict the existence of PPC at low temperatures. Previously reported results of experimental investigations of most semiconductor materials have shown PPC effect predominantly at low temperatures. Neither, the macroscopic barrier nor the DX center models account for PPC which may be observable above 150° K. and still exists up to room temperatures.

Previous III-V mixed crystal semiconductors, that is, semiconductor crystals formed of elements from groups III and V of the Periodic Table, exhibit PPC at low temperatures. However, PPC in these crystals cannot be quenched by infrared radiation.

The prior art also discloses solid state imagers in which an optical image is projected onto a large-scale integrated circuit device which detects the light of the image and develops corresponding image signals. A widely used imager of this type includes a charge-coupled-device (CCD) imager which absorbs light in a photo-responsive substrate, such as silicon. The absorbed photons of light generate charge carriers which are then used to develop the image signals.

SUMMARY OF THE INVENTION

The present invention is concerned with new PPC crystals which exhibit PPC at temperatures in excess of 70° K., making PPC effects possible at room temperatures. While the inventors do not wish to be bound to any theory of operation, experimental results suggest that the high temperature PPC effects observed with the crystals of the invention are caused by random local potential fluctuations induced by composition fluctuations in the crystals. The energy gap therefore can be easily controlled over a wide range by varying the composition of the crystals.

The single crystals of the present invention preferably include zinc, cadmium and selenium in the formula $Zn_xCd_{1-x}Se$, forming hexagonal crystals which are capable of operating at room temperature. In the above formula, x is up to about 0.4, and more preferably from about 0 to 0.4 and most preferably from about 0.01 to 0.4. The crystals exhibit two PPC states—a first state in which PPC decays faster as temperature decreases, and a second in which PPC decays more rapidly as temperature increases. In particularly preferred forms, crystals of the formula $Zn_{0.3}Cd_{0.7}Se$ are used, these being prepared from purified ZnSe and CdSe powders.

The invention also comprehends electrical apparatus making use of the novel PPC crystals. Such apparatuses include for example infrared detectors, photon dose meters, photon wavemeters, and solid state imagers.

In particularly preferred forms, the apparatus of the invention includes an infrared detector of mixed II-VI crystals as described above, and further comprises a pair of electrical terminals coupled with the crystal along with circuit means connected with the terminals in order to place the crystal in an electrical circuit together with a power source and a current-responsive operating device. Once PPC is induced in the detector by visible illumination, the conductivity reaches a saturation level, and is quenched to a lower saturation level by absorption of infrared light.

Another embodiment of the present invention includes a solid state imager which overcomes the problems of the prior art imagers outlined above. The present imager uses mixed II-VI crystals to detect light and generate charge carriers corresponding to the intensity of the detected light. These generated charge carriers do not dissipate quickly. Instead, the generated charge carriers persist for a very long period of time due to the PPC effect exhibited by the mixed II-VI crystals. This long storage time assures that an image will not be lost if it is not processed and stored immediately.

DESCRIPTION OF THE PREFERRED EMBODIMENT

Figure 1:
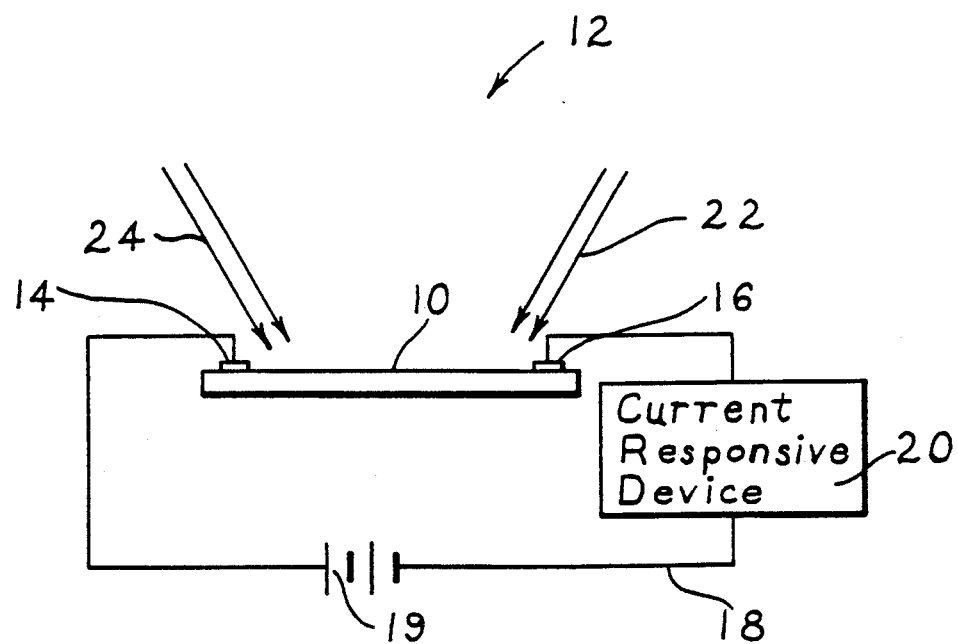
FIG. 1 is a schematic representation of an electrical device making use of a PPC crystal of the invention.

Referring now to the drawings, a representative electrical apparatus in accordance with the present invention is illustrated in FIG. 1. A crystal 10 ($Zn_{0.3}Cd_{0.7}Se$ having preferred dimensions of 1 cm length and width, 0.1 cm thickness and a dark room resistivity of about $10^9$ ohm-cm) in accordance with the invention is shown as a part of an infrared detector 12. Those skilled in the art will appreciate that the crystals of the invention may be used in connection with any number of other electrical apparatus where PPC characteristics are desired, such as infrared wavemeters. In any event, electrical terminals 14, 16 are connected to crystal 10 at spaced locations as shown. The terminals 14, 16 are in turn connected in series via wire 18 with a power source (here battery 19) and a current-responsive device 20, particularly an ammeter for detecting current flow.

Crystal 10 preferably is of the formula $Zn_{0.3}Cd_{0.7}Se$, although any II-VI crystal having the general formula $Zn_xCd_{1-x}Se$ where x is up to 0.4, may be utilized, so long as it exhibits the desired degree of PPC activity.

In the use of detector 12, a source of visible light 22 induces PPC in semiconductor crystal 10, thus completing the circuit as indicated by ammeter 20. The latter indicates current flow as indicated in bold lines in FIG. 2. Upon absorption of infrared light 24 by crystal 10, PPC activity is quenched, and the magnitude of current through the described electrical circuit diminishes to an extent measured by ammeter 20.

Figure 2:
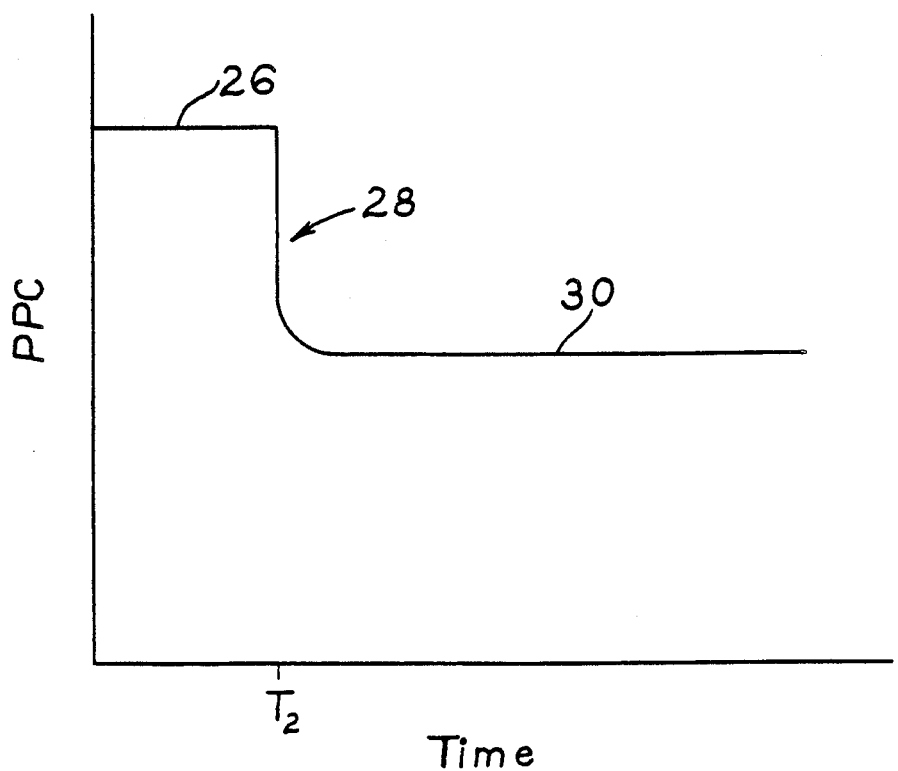
FIG. 2 is an experimentally observed electrical characteristic at room temperature of an infrared detector in accordance with the invention.

Observed room temperature electrical characteristics of detector 12 is shown in FIG. 2. Visible light 22 causes PPC to saturate to level 26. Subsequent absorption of broad band infrared light 24 at time $T_2$ causes a sharp decline 28 in conductibility to a reduced, quenched level 30.

Preferably, crystals in accordance with the invention are grown from solid solution using purified ZnSe and CdSe powders in appropriate weight proportions as starting materials. In constructing electrical apparatus using the crystals, gold leads are attached to a crystal body using indium solder, with the junctions being carefully tested for ohmic contacts.

In testing the PPC crystals hereof, each sample was attached to a copper sample holder in a manner to ensure good thermal contact, with electrical isolation. A photon dose of about $2 \times 10^{13}$ photons/$cm^2$ per second was delivered to the mounted sample using a mercury lamp as the excitation light source. Appropriate filters were used so that two lines at 435.8 nm and 546.1 nm dominated the output spectrum of the excitation light.

Measurements of PPC below room temperatures were performed in a closed-cycle refrigerator wherein the system was cooled in darkness to a desired temperature. Once the PPC measurement was taken, the system was warmed to room temperature and allowed to relax to the equilibrium. This procedure was repeated for each temperature thus ensuring identical initial conditions of measurement.

Figure 3:
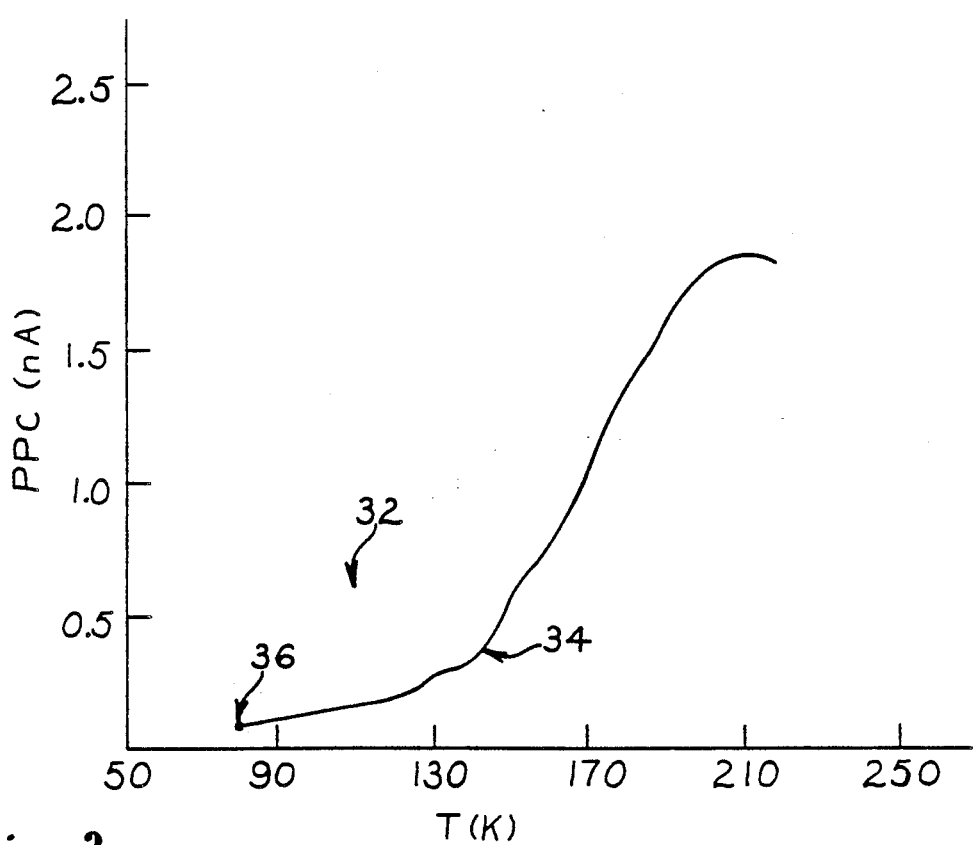
FIG. 3 is a graph of the buildup levels of PPC in the crystal of the invention as a function of temperature.

As shown in FIG. 3, PPC in the crystal $Zn_{0.3}Cd_{0.7}Se$ increased slowly in the temperature region 32 of 70° K. to 120° K., and then increased sharply in temperature region 34 near 120° K. As the temperature was lowered below point 36 at 70° K., virtually no PPC (or even conventional photoconductivity) was observed.

Figure 4:
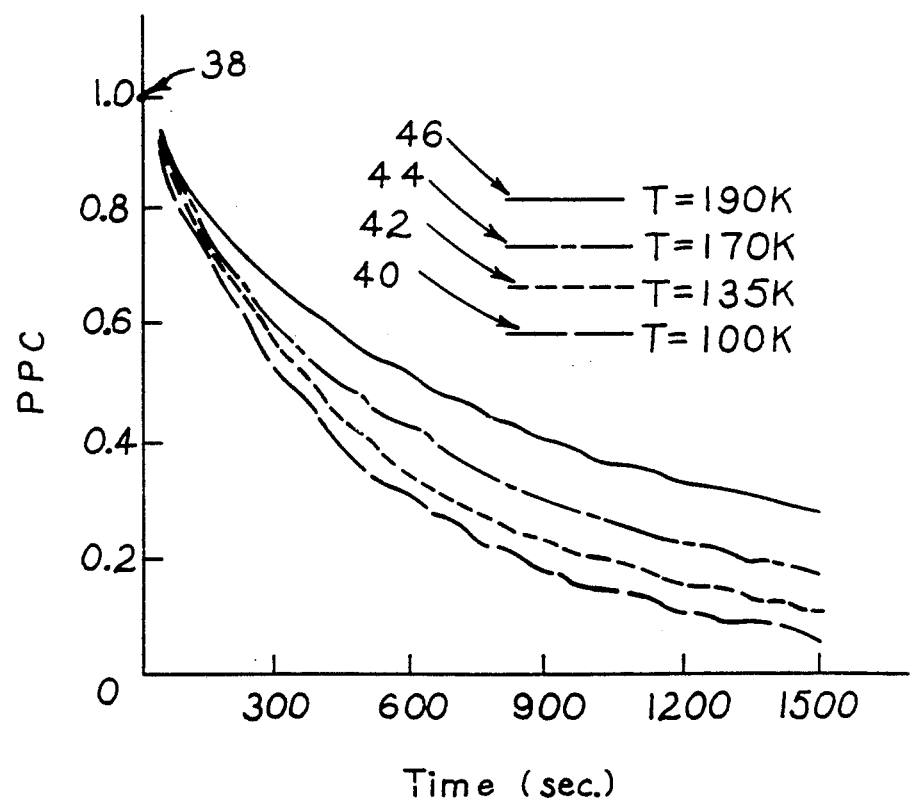
FIG. 4 is a graph showing PPC decay curves for a PPC crystal at four selected temperatures.

FIG. 4 shows PPC decay in the same crystal over time at four different temperatures, with each curve normalized to unity at point 38 where time=0. Curve 40 represents a temperature of 100° K., curve 42 represents 135° K., curve 44 represents 170° K., and curve 46 represents 190° K. The slopes of the respective curves demonstrate that contrary to expected decay behavior, PPC in the crystals of the invention decays faster as temperature decreases. However, when temperature increases to above 220° K., PPC decays more rapidly as temperature increases. Despite the increased decay rate, useful PPC continues to exist in the crystal at room temperature.

Figure 5:
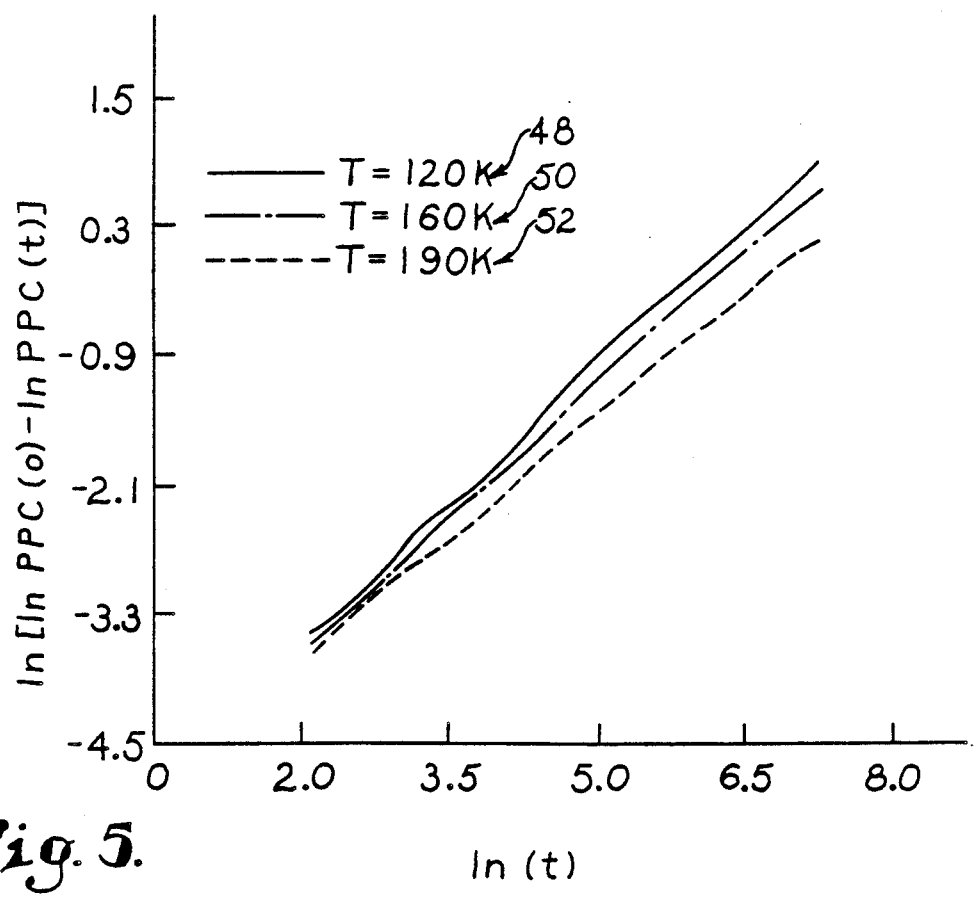
FIG. 5 is a plot of $\ln[\ln PPC(0)-\ln PPC(t)]$ versus $\ln(t)$ for a PPC crystal at three selected temperatures.

FIG. 5 illustrates representative plot of the equation $\ln[\ln PPC(0) - \ln PPC(t)]$ vs. $\ln(t)$ in the crystal $Zn_{0.3}Cd_{0.7}Se$ at three temperatures. Curve 48 represents 120K, curve 50 represents 160° K., and curve 52 represents 190° K. The perfect linear behavior of the plots demonstrates that the PPC decay is well described by the stretched-exponential function $PPC(t) = PPC(0) \exp[-(t/\tau)^\beta]$, where beta and tau are two decay parameters, with beta and tau for different temperatures determined from least square fit with empirical data. A stretch-exponential relaxation evolution reveals similarities of the present crystal systems to the disordered systems, and thus implies that microscopic random potential fluctuations are the origin of the observed PPC phenomena.

Figure 6:
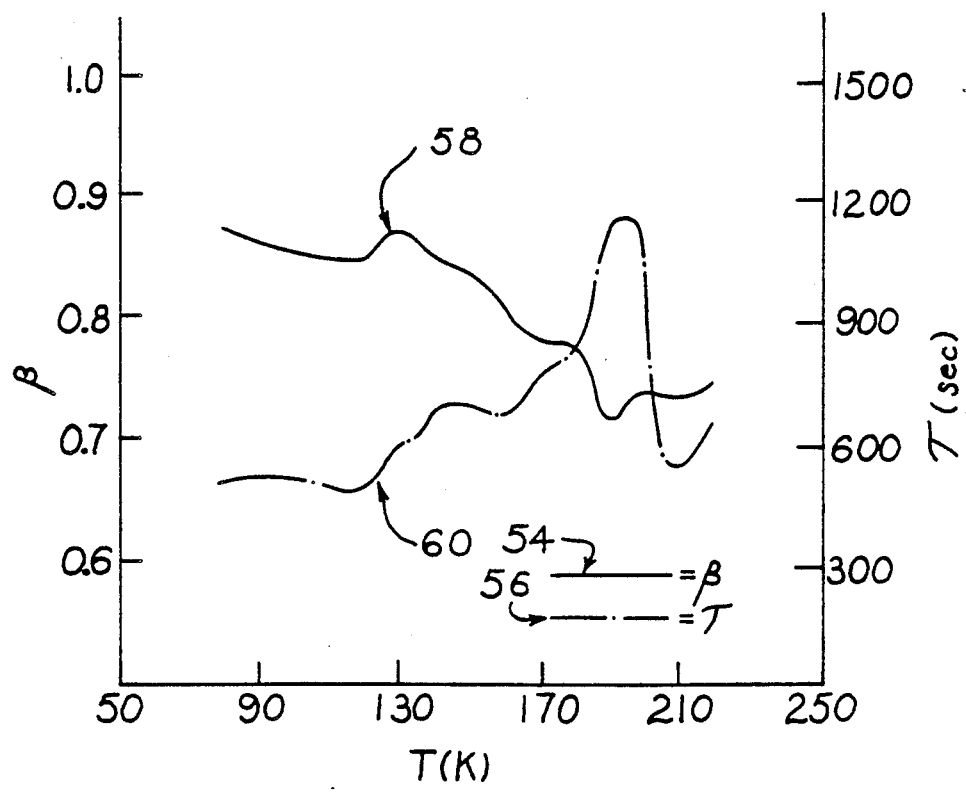
FIG. 6 is a plot of the decay parameters beta and tau versus temperature for a PPC crystal in accordance with the invention.

FIG. 6 illustrates beta and tau as functions of temperature in curves 54 and 56 respectively. The value of beta is about $0.85 \pm 0.03$ below 120° K., and clearly decreases at point 58 near 120° K. The characteristic decay time constant, tau, also shows a phase transition at point 60 near 120° K. At temperatures above 220° K., the decay of PPC is no longer well described by the stretched-exponential model. The PP relaxation rate increases as temperature increases in the region of T greater than 220° K.

The following example describes the preferred procedures for preparation of a representative crystal of the present invention.

EXAMPLE I $Zn_{0.2}Cd_{0.8}Se$ II-VI mixed crystals were grown from the vapor phase in a closed moving crucible which permitted an efficient utilization of the change and flexibility in the dimensions of the crystal. The crucible was made from standard clear quartz tubing and was placed inside a gas-tight mullite tube. The outer tube of the crucible was sealed with a blunt conical tip. The mullite tube was closed at one end and sealed at the other end with a tapered glass joint to permit evacuation of the tube or injection of slow flow of an inert gas at atmospheric pressure.

A $Zn_{0.2}Cd_{0.8}Se$ charge was sintered by packing 20 g of purified ZnSe powder and 80 g of purified CdSe powder into a quartz tube and vacuum baked at 900° C.-1000° C. for approximately 10 hours. The baked charge of $Zn_{0.2}Cd_{0.8}Se$ was then placed in the crucible and baked with a closed quartz tube fitting snugly into the crucible. The mullite tube containing the quartz crucible was evacuated $10^{-5}$ Torr and slowly heated to 500° C. in a zone furnace. After one hour of baking to remove volatile impurities, a slow stream of argon at 1 atmospheric pressure was injected and allowed to escape by bubbling through a bottle containing dibutylphthalate. The furnace temperature was increased to about 1150° C. while maintaining the argon stream at 1 atmosphere, for about 24 hours. The entire mullite tube was then pushed so that the tip of the crucible was moved into the cooler zone in a temperature gradient of 20° C./cm at a rate of 1 mm/hour. As the tube moved, the supersaturation at the tip increased until nucleation occurred. A single crystal having a hexagonal structure grew out from the tip at a rate of approximately 1 mm/hour.

The crystals of the invention have a number of advantageous features. Principal among these are the presence of significant PPC effects at relatively high temperatures of about 70° K. and stretched-exponential decay at temperature T of 70° K.$<$T$<$220° K. Moreover, PPC in the crystals exhibit, fast infrared radiation quenching response times on the order of $10^{-9}$ seconds, with high sensitivity and low electrical noise characteristics.

Figure 7:
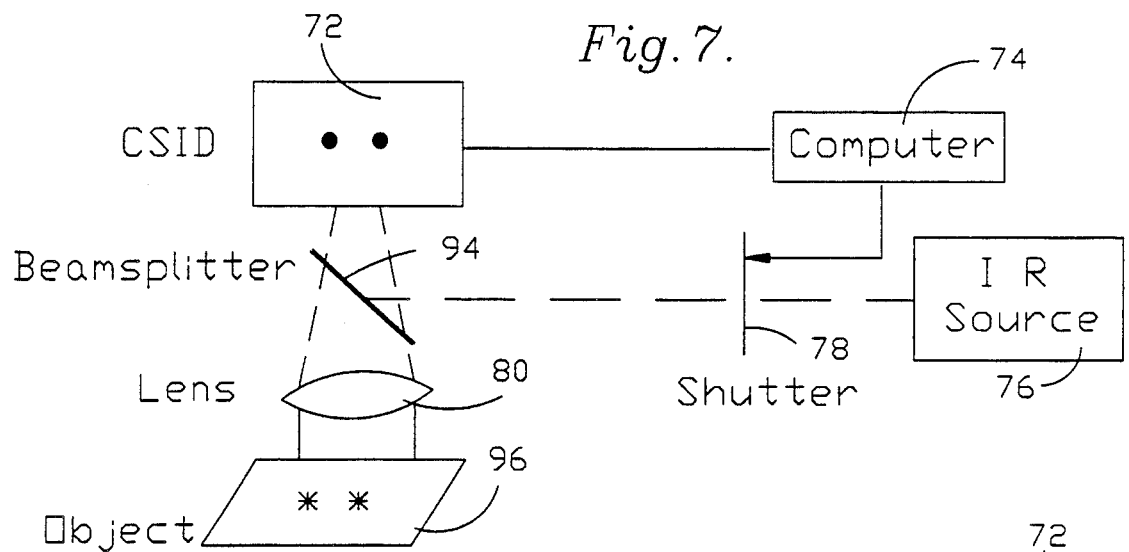
FIG. 7 is a schematic representation of an embodiment of an imaging apparatus using PPC crystals.

FIG. 7 illustrates imaging apparatus 70 as an embodiment of the present invention which stores an image by utilizing the phenomenon of PPC. Preferred apparatus 70 includes a charge storage image device 72 (CSID), computer 74, infrared light source 76, electric shutter 78, and lens 80.

Figure 8:
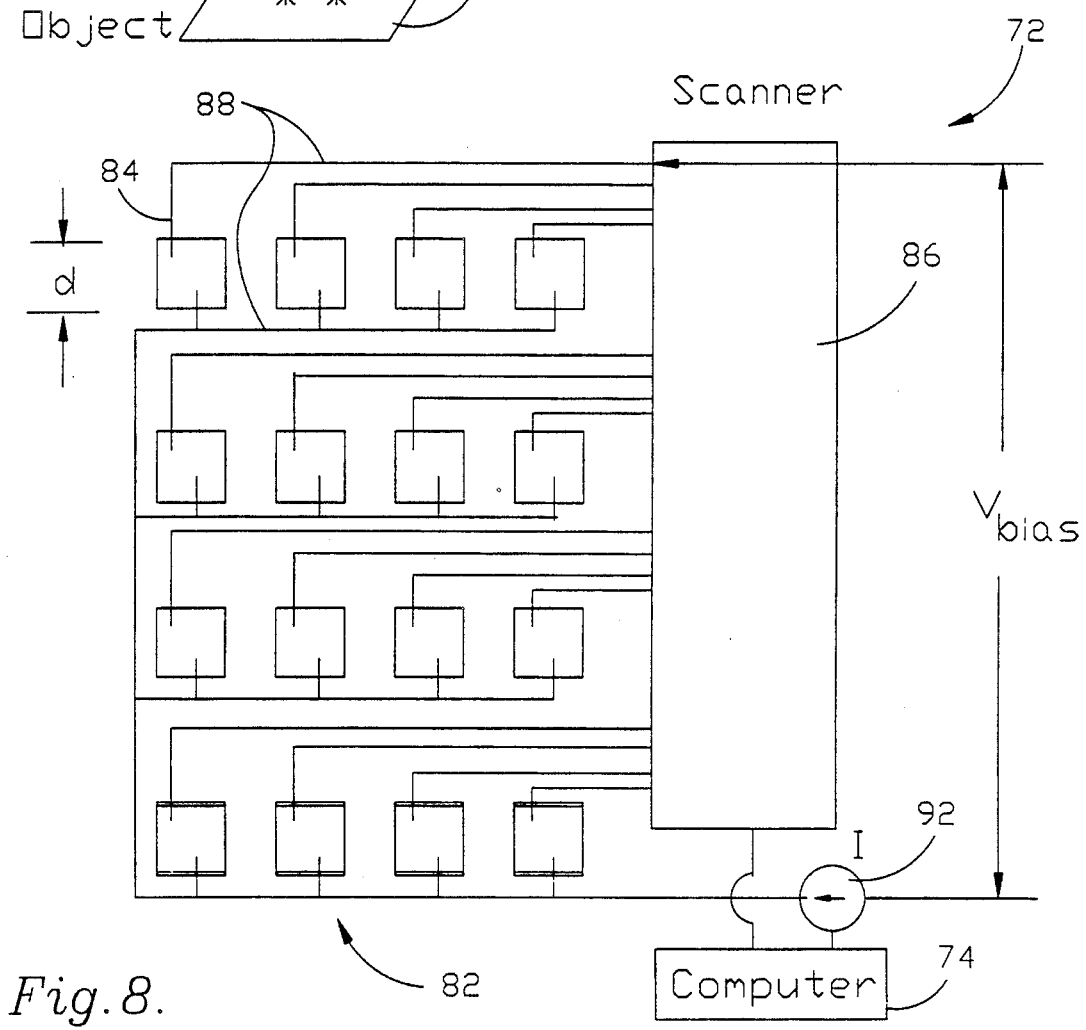
FIG. 8 is a schematic representation showing additional details of the charge storage image device of FIG. 7.

As illustrated in more detail in FIG. 8, CSID 72 includes an array 82 of II–VI semiconductor thin film elements 84, scanner 86 and electrical connections 88 from scanner 86 to each element 84 for applying a bias voltage ($V_{bias}$) across each element 84 so that the current through each element 84 can be monitored as represented by 92.

In the preferred embodiment, CSID 72 includes an NxN array 82 of elements 84 with N in the order of 200 to 500. The array 82 presents a generally planar image impingement surface and is fabricated by depositing semiconductor thin film elements 84 on a transparent material, with the transparent material as the front surface. The elements 84 are composed of material having the general formula $Zn_xCd_{1-x}Se$ where x ranges from about 0 to 0.4. The configuration of the elements 84 is generally square, with each side having a dimension ('d' in FIG. 8) of about 100 micrometers. The contact leads are connected in the rear surface of elements 84 (not shown).

Lens 80 is a circular, generally flat focusing lens presenting opposed, convex surfaces. Lens 80 presents a focal plane at a certain distance from lens 80 at which point light rays passing through lens 80 converge. Lens 80 is positioned so that the impingement surface of CSID 72 lies in the focal plane of lens 80 and further so that the flat plane of lens 80 is generally parallel to the planar surface of CSID 72.

Computer 74, which can be either a computer or a microcomputer, is operably connected to both CSID 72 and shutter 78. Computer 74 reads and processes data from CSID 72 and has memory capability to store the processed data. Beamsplitter 94 is fixedly mounted between lens 80 and CSID 72 at an angle oblique to the planar surfaces of lens 80 and CSID 72 and allows passage of visible light therethrough but reflects infrared light. Shutter 78 is opened and closed by computer 74 and swingably mounted between infrared source 76 and beamsplitter 94 so that when shutter 78 is open, infrared light from infrared source 76 reflects off the surface of beamsplitter 94. Conversely, when shutter 78 is closed infrared light is blocked and cannot reach beamsplitter 94.

In operation to store a visible image, the PPC of each element 84 is first initialized to a reference level. This is accomplished by exposing elements 84 to infrared light which quenches and thereby lowers the PPC of each element. In response to a command from computer 74 to open shutter 78, infrared light from source 76 reflects off beamsplitter 94 and impinges on elements 84.

This quenching of the PPC is illustrated in FIG. 2. First PPC level 26 in FIG. 2 corresponds to the PPC of an element 84 before it has been exposed to infrared light. The lower level 30 corresponds to the quenched PPC level after the element 84 has been exposed to infrared light at a time $T_2$. The magnitude of the drop in PPC induced by infrared light depends upon the intensity of the infrared light.

After initializing elements 84 to a reference PPC level, computer 74 sequentially reads, by way of scanner 86, the current 82 through each element 84 induced by the bias voltage across each element 84. The current 92 through each element 84 corresponds to the reference, that is the quenched PPC of each element 84. This initial, reference current level through each element is converted to digital form using conventional means and stored in the memory of computer 14.

After storing data representative of a reference current for each element 84, apparatus 70 is oriented so that an image of object 96 passes through lens 80. Lens 80 presents the image to the CSID 72 so that the elements 84 of array 82 are each impinged by a portion of the image focal plane of the detected object 96. Each element 84 collects a different amount of photons after being exposed to the visible image. The collected photons excite a corresponding amount of charge carriers in each element. These excited charge carriers persist for a very long period of time and so, will not dissipate before data representative thereof can be stored. Because each element 84 stores an amount of charge carriers which corresponds to the number of collected photons, an image is effectively mapped into the array 82 in the form of stored charge carriers. These stored charge carriers contribute to PPC and each element 84 of the array 82 corresponds to a pixel of the image mapped into the array 82.

Scanner 86 then reads the new current level through the exposed elements 84, referred to as the exposed current levels, and computer 74 stores corresponding data. Computer 74 next determines the magnitude of the change in current for each element 84 by subtracting the stored values of the exposed current levels from the stored values of the reference current levels. These values representing the current level changes in each element 84 are stored and correspond to the intensity of respective pixels in the image. These pixel values can then be displayed using conventional means such as a CRT monitor.

After an image has been stored, computer 74 must again initialize array 82 in preparation for storing another image. The process described above is then repeated.

Imaging apparatus 70 can also be configured to store infrared images. The infrared light source 76 can be exchanged for a visible light source. This visible light source is used to initialize the array 82 by building up PPC levels and storing charge carriers in each element. This is the opposite effect of initialization with the infrared source 76. Exposure to an infrared image results in release of the stored charge carriers and quenching of PPC in each element 84. The same basic procedure is used as explained above to measure the initial and exposed current levels and to obtain the data used to display the image.

Moving pictures can also be produced using apparatus 70 by sequentially storing successive images. These successive images can either be stored or simultaneously displayed to produce a moving picture.

Having thus described the preferred embodiments of the present invention, the following is claimed as new and desired to be secured by Letters Patent:

1. An apparatus for storing an image, said apparatus comprising:
   an array of light responsive elements configured for impingement of an image thereon,
   each of said elements being composed of material having the general formula $Zn_xCd_{1-x}Se$ where x ranges from about 0 to 0.4, and exhibiting the effect of persistent photoconductivity in which impingement of visible light thereon results in a level of photoconductivity, and in which impingement of infrared light thereon results in a change to a lower level of photoconductivity;
   means for initializing the photoconductivity of said elements;
   means for presenting an image to be stored for impingment on said array for changing the photoconductivity of the elements on which the image impinges in accordance with one of visible and infrared light making up the image; and
   means for detecting the respective changes in photoconductivity of said elements resulting from impingement of an image thereon, and for storing data representative of said changes, such being representative of the image.

2. The apparatus as set forth in claim 1, said array presenting a generally rectangular configuration and presenting a generally planar, image impingement surface.

3. The apparatus as set forth in claim 1, said elements being generally square with sides of about 100 micrometers.

4. The apparatus as set forth in claim 1, said array having sides defining a polygonal configuration with each side including about 200 to 500 elements.

5. The apparatus as set forth in claim 1, wherein each element corresponds to a pixel of an image to be stored.

6. The apparatus as set forth in claim 1, said initializing means including means for producing visible light for impinging said elements with visible light in order to initialize the photoconductivity of each element to a uniform level.

7. The apparatus as set forth in claim 6, said initializing means further including a shutter positioned between the visible light producing means and said elements for selectively allowing the impingement of said elements by visible light.

8. The apparatus as set forth in claim 1, said initializing means including means for producing infrared light for impinging said elements with infrared light in order to initialize the photoconductivity of each element to a uniform level.

9. The apparatus as set forth in claim 8, said initializing means further including a shutter positioned between the infrared light producing means and said elements for selectively allowing the impingement of said elements by infrared light.

10. The apparatus as set forth in claim 1, said presenting means including means for focusing the image to be stored, said focusing means presenting a focal plane such that the image impinges on said elements.

11. The apparatus as set forth in claim 1, said detecting means including a computer.

12. The apparatus as set forth in claim 11, said detecting means further including means for applying a bias voltage across each element for inducing respective current flows corresponding to the photoconductivity of each element, means for detecting said current flows and for storing data representative thereof, and means for determining and storing the magnitude of any change in current through each element.

13. The apparatus as set forth in claim 1, said detecting means including a micro-computer.

14. The apparatus as set forth in claim 1, wherein the data stored for each element is representative of data for a corresponding pixel for reproducing the image.

15. The apparatus as set forth in claim 1, further including means for sequentially storing successive images thereby creating a set of images representative of a moving picture.

16. The apparatus as set forth in claim 1, further including means for displaying said stored data.

17. The apparatus as set forth in claim 16, said displaying means including a CRT monitor.

18. An apparatus for storing an image, said apparatus comprising:
   an array of light responsive elements configured for impingement of an image thereon,
   each of said elements being composed of material exhibiting the effect of persistent photoconductivity in which impingement of visible light thereon results in a level of persistent photoconductivity, and in which impingement of infrared light thereon results in a change to a lower level of photoconductivity;
   means for presenting an image to be stored for impingement on said array for changing the photoconductivity of the elements on which the image impinges in accordance with one of visible and infrared light making up the image; and
   signal processing means coupled with said array for storing data representative of initialized levels of photoconductivity of said elements,
      for detecting the respective changes in photoconductivity of said elements from said initialized levels resulting from impingement of an image thereon, and
      for storing data representative of said changes, such being representative of the image.

19. The apparatus as set forth in claim 18, said elements being composed of material having the general formula $Zn_xCd_{1x}Se$ where x ranges from about 0 to 0.4.

20. The apparatus as set forth in claim 18, said signal processing means including means for producing and impinging one of infrared and visible light on said array in order to initialize the photoconductivity of said elements to said respective initialized levels.

21. A method of storing an image, said method comprising the steps of:
   creating an array of light responsive elements configured for impingement of an image thereon wherein each of said elements being composed of material exhibiting the effect of persistent photoconductivity in which impingement of visible light thereon results in a level of persistent photoconductivity, and in which impingement of infrared light thereon results in a change to a lower level of photoconductivity;

presenting an image to be stored for impingement on said array for changing the photoconductivity of the elements on which the image impinges in accordance with one of visible and infrared light making up the image;

storing data representative of initialized levels of photoconductivity of said elements;

detecting the respective changes in photoconductivity of said elements from said initialized levels resulting from impingement of an image thereon; and storing data representative of said changes, such being representative of the image.

* * * * *